(12) United States Patent
Cho et al.

(10) Patent No.: US 11,735,459 B2
(45) Date of Patent: Aug. 22, 2023

(54) ELECTROSTATIC CHUCK

(71) Applicant: MICO CERAMICS LTD., Anseong-si (KR)

(72) Inventors: Mina Cho, Anseong-si (KR); Jung Hyun Park, Anseong-si (KR)

(73) Assignee: MICO CERAMICS LTD., Anseong-si (KR)

( * ) Notice: Subject to any disclaimer, the term of this patent is extended or adjusted under 35 U.S.C. 154(b) by 0 days.

(21) Appl. No.: 17/930,361

(22) Filed: Sep. 7, 2022

(65) Prior Publication Data

US 2023/0178408 A1 Jun. 8, 2023

(30) Foreign Application Priority Data

Dec. 8, 2021 (KR) .................. 10-2021-0174516

(51) Int. Cl.
| | | |
|---|---|---|
| *H01T 23/00* | (2006.01) | |
| *H01L 21/683* | (2006.01) | |
| *H01L 21/67* | (2006.01) | |
| *H01J 37/32* | (2006.01) | |

(52) U.S. Cl.
CPC .... *H01L 21/6833* (2013.01); *H01J 37/32697* (2013.01); *H01L 21/67063* (2013.01)

(58) Field of Classification Search
None
See application file for complete search history.

(56) References Cited

U.S. PATENT DOCUMENTS 4,585,969 A * 4/1986 Tanaka .................. H02N 2/101
  310/328
2004/0250766 A1  12/2004 Fink
2011/0063771 A1 * 3/2011 Nishioka ............. H01L 21/6833
  361/234
2015/0340261 A1  11/2015 Katayama et al.
2018/0020544 A1 * 1/2018 Takebayashi .......... H05K 1/144
2021/0327741 A1  10/2021 Nagayama et al.

FOREIGN PATENT DOCUMENTS

| | | |
|---|---|---|
| CN | 104752118 A | 7/2015 |
| JP | 7-74234 A | 3/1995 |
| JP | 2002-141403 A | 5/2002 |
| JP | 2007-294990 A | 11/2007 |
| JP | 2017-84884 A | 5/2017 |
| KR | 10-2006-0006814 A | 1/2006 |
| KR | 10-2009-0073573 A | 7/2009 |
| KR | 10-2021-0046689 A | 4/2021 |

OTHER PUBLICATIONS

Office Action for SG 10202251138X by Intellectual Property Office of Singapore dated May 11, 2023.

* cited by examiner

*Primary Examiner* — Stephen W Jackson
(74) *Attorney, Agent, or Firm* — Broadview IP Law, PC

(57) ABSTRACT

The present disclosure relates to an electrostatic chuck. The electrostatic chuck according to the present disclosure may include a base substrate; an electrostatic chuck plate fixed on the base substrate, the electrostatic chuck plate having an electrode therein; and an electrode part disposed in a hole in the base substrate to supply power to the electrode, wherein the electrode part may include a housing inserted into the hole in the base substrate, an electrode rod passing through the inner wall of the housing such that one end thereof is in contact with the electrode; and an elastic support body configured to support the electrode rod at multiple points on the inner wall of the housing.

7 Claims, 8 Drawing Sheets

ELECTROSTATIC CHUCK

CROSS-REFERENCE TO RELATED APPLICATION(S)

This application is based on and claims priority under 35 U.S.C. 119 to Korean Patent Application No. 10-2021-0174516, filed on Dec. 8, 2021, in the Korean Intellectual Property Office, the disclosure of which is herein incorporated by reference in its entirety.

BACKGROUND OF THE INVENTION

1. Field of the invention

The present disclosure relates to an electrostatic chuck and, more particularly, to an electrostatic chuck having a terminal connection structure of an electrode part for improving high-temperature durability.

2. Description of the Prior Art

A semiconductor element or a display element is manufactured by laminating multiple thin-film layers including a dielectric layer and a metal layer on a glass substrate, a flexible substrate, or a semiconductor wafer substrate and patterning the same through semiconductor processes such as a chemical vapor deposition (CVD) process, a physical vapor deposition (PVD) process, an ion implantation process, and an etching process. A chamber device for performing such semiconductor processes has an electrostatic chuck (ESC) for supporting various substrates such as a glass substrate, a flexible substrate, and a semiconductor wafer substrate, and for holding the substrates by using an electrostatic force or for plasma treatment thereof.

FIG. 1A illustrates the structure of an electrode part of a conventional electrostatic chuck.

Referring to FIG. 1A, the conventional electrostatic chuck has an upper plate 1 and a lower plate 2 bonded through an adhesive 5 such as silicone or epoxy, and has an electrode rod 20 electrically connected to an electrode 20 through the lower plate 2 in order to supply power to the electrode 20 embedded in the upper plate 1. To this end, the electrode 20 and the electrode rod 20 are bonded by soldering or brazing through a filler 30.

FIG. 1B illustrates the occurrence of shear stress in an electrode connection surface of an electrode part of a conventional electrostatic chuck.

Referring to FIG. 1B, the electrode part of the conventional electrostatic chuck may be exposed to a high-temperature environment of 100° C. of higher, if necessary, during the above-mentioned semiconductor processes. Shear stress occurs in surfaces of connection between the electrode 20 and the electrode rod 20 through a filler 30 due to a difference in thermal expansion coefficient of both materials, thereby resulting in cracking or short-circuiting of the filler 30. This poses a problem in that electric connection becomes defective or is even separated.

SUMMARY OF THE INVENTION

Therefore, the present disclosure has been made to solve the above-mentioned problems, and it is an aspect of the present disclosure to provide an electrostatic chuck capable of preventing separation of electric connection due to shear stress on a connection surface which connects an electrode rod for supplying power in an electrode part and an electrode inside an electrostatic chuck, thereby maintaining stable electric connection.

To summarize features of the present disclosure, an electrostatic chuck according to an aspect of the present disclosure may include: a base substrate; an electrostatic chuck plate fixed on the base substrate, the electrostatic chuck plate having an electrode therein; and an electrode part disposed in a hole in the base substrate to supply power to the electrode, and the electrode part may include: a housing inserted into the hole in the base substrate; an electrode rod passing through the inner wall of the housing such that one end thereof is in contact with the electrode; and an elastic support body configured to support the electrode rod at multiple points on the inner wall of the housing.

The electrode part may include a support part disposed in the inner wall of the housing and configured to receive a plurality ball springs as the elastic support body, and the support part may include a plurality of ball springs provided along the circumference thereof and configured to apply an elastic force toward the center thereof.

The electrode rod may include a contact part which is engaged with the one end thereof by screw coupling to be in contact with the electrode.

The electrode rod may further include a head part formed at the other end thereof and having a diameter greater than a through-hole, and the housing may include: a first housing part including the support part and a second through-hole in which the head part of the electrode rod is stably placed; and a second housing part having a third through-hole through which the contact part passes and engaged with the first housing part.

The first housing part and the second housing part are engaged with each other by screw coupling.

The support part may include corresponding groove parts in which the plurality of ball springs are stably placed, and each of the ball springs stably placed in the groove parts may include a spring having one side supported by the bottom surface of the corresponding groove part, and a ball coupled to the other side of the spring.

The support part may have a cylindrical or polygonal tubular shape.

An electrostatic chuck 100 according to the present disclosure is configured such that an electrode rod 520 for supplying power in an electrode part 500 and a contact part 530 coupled thereto are supported by an elastic force from an elastic support (for example, multiple ball springs 511). Therefore, as in FIG. 2B, even if shear stress occurs on a connection surface which connects an electrode 320 in an electrostatic plate 300 made of a ceramic material so as to supply power in the electrode part 500 and the contact part 530 by a physical force, thereby slightly moving the electrode rod 520 and the contact part 530 horizontally, electric connection between the electrode 320 and the contact part 530 can remain stable without separation.

In addition, by introducing the electrostatic chuck 100 structure according to the present disclosure, separation of electric connection in the electrode part 500 during etching processes among semiconductor processes having related heat cycles of high and low temperatures is prevented, and such a stable electric connection structure may improve the lifespan of the electrostatic chuck.

BRIEF DESCRIPTION OF THE DRAWINGS

The accompanying drawings, which are included as a part of the detailed description to help the understanding of the present disclosure, provide embodiments of the present disclosure and, together with the detailed description, explain the technical spirit of the present disclosure.

DETAILED DESCRIPTION OF THE EXEMPLARY EMBODIMENTS

Figure 1A:
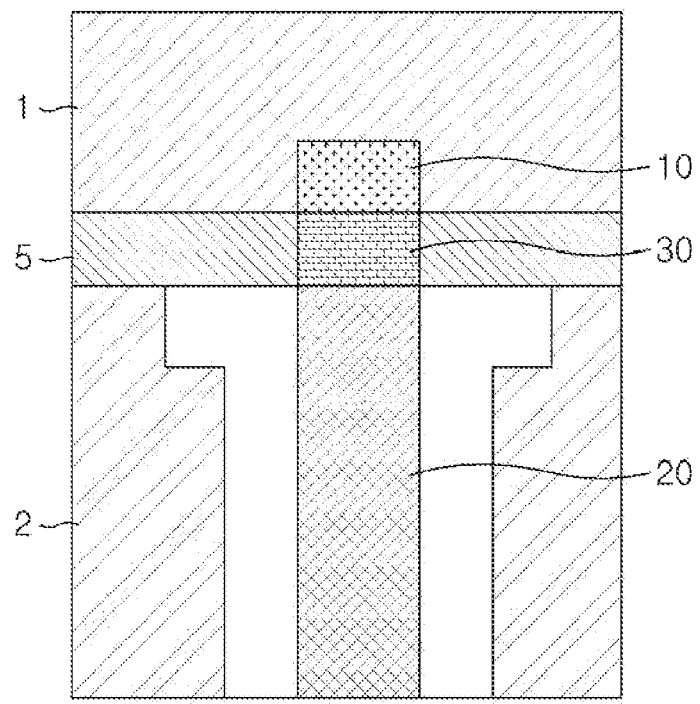
FIG. 1A illustrates a structure of an electrode part of a general electrostatic chuck.
Figure 1B:
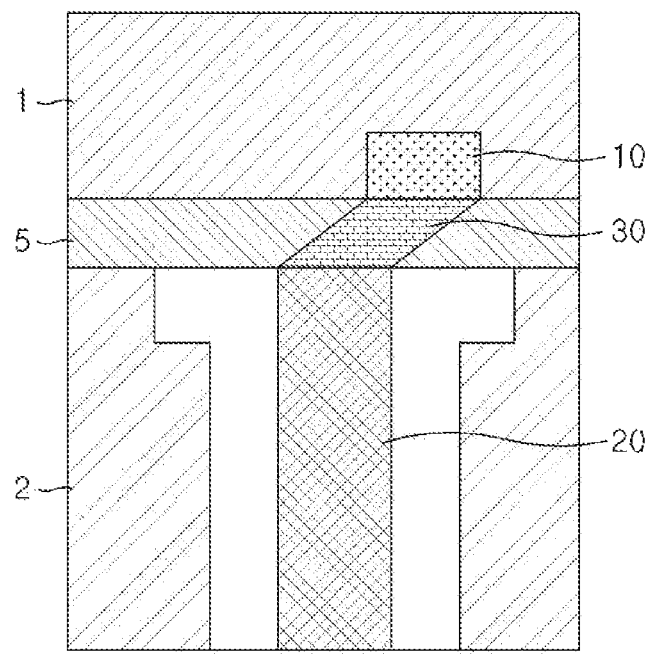
FIG. 1B illustrates shear stress occurring on a contact surface between an electrode and an electrode part of a general electrostatic chuck.

Hereinafter, the present disclosure will be described in detail with reference to the accompanying drawings. In this case, the same elements in each drawing are denoted by the same reference numerals if possible. In addition, detailed descriptions of already known functions and/or configurations will be omitted. The content disclosed below will focus on parts necessary to understand operations according to various embodiments, and descriptions of elements that may obscure the gist of the description will be omitted. In addition, some elements in the drawings may be exaggerated, omitted, or schematically illustrated. The size of each element does not fully reflect the actual size, so the contents described herein are not limited by the relative size or spacing of the elements drawn in each drawing.

In describing the embodiments of the present disclosure, when it is determined that the detailed description of the known technology related to the present disclosure may unnecessarily obscure the gist of the present disclosure, the detailed description thereof will be omitted. The terms to be described later are terms defined in consideration of functions in the present disclosure, which may vary according to intentions or customs of users and operators. Therefore, the definition should be made based on the content throughout this specification. The terms used in the detailed description is for the purpose of describing the embodiments of the present disclosure only, and should not be limiting in any way. Unless explicitly used otherwise, the singular forms include the plural forms. In this description, expressions such as "comprising" or "including" are intended to indicate certain features, numbers, steps, operations, elements, one or a combination thereof. It should not be construed to exclude the presence or possibility of one or more other features, numbers, steps, operations, elements, or one or a combination thereof, which are other than those described herein.

In addition, terms, such as first and a second, may be used to describe various elements, but the elements are not limited by the terms, and the terms are used only for the purpose of distinguishing one element from another.

Figure 2A:
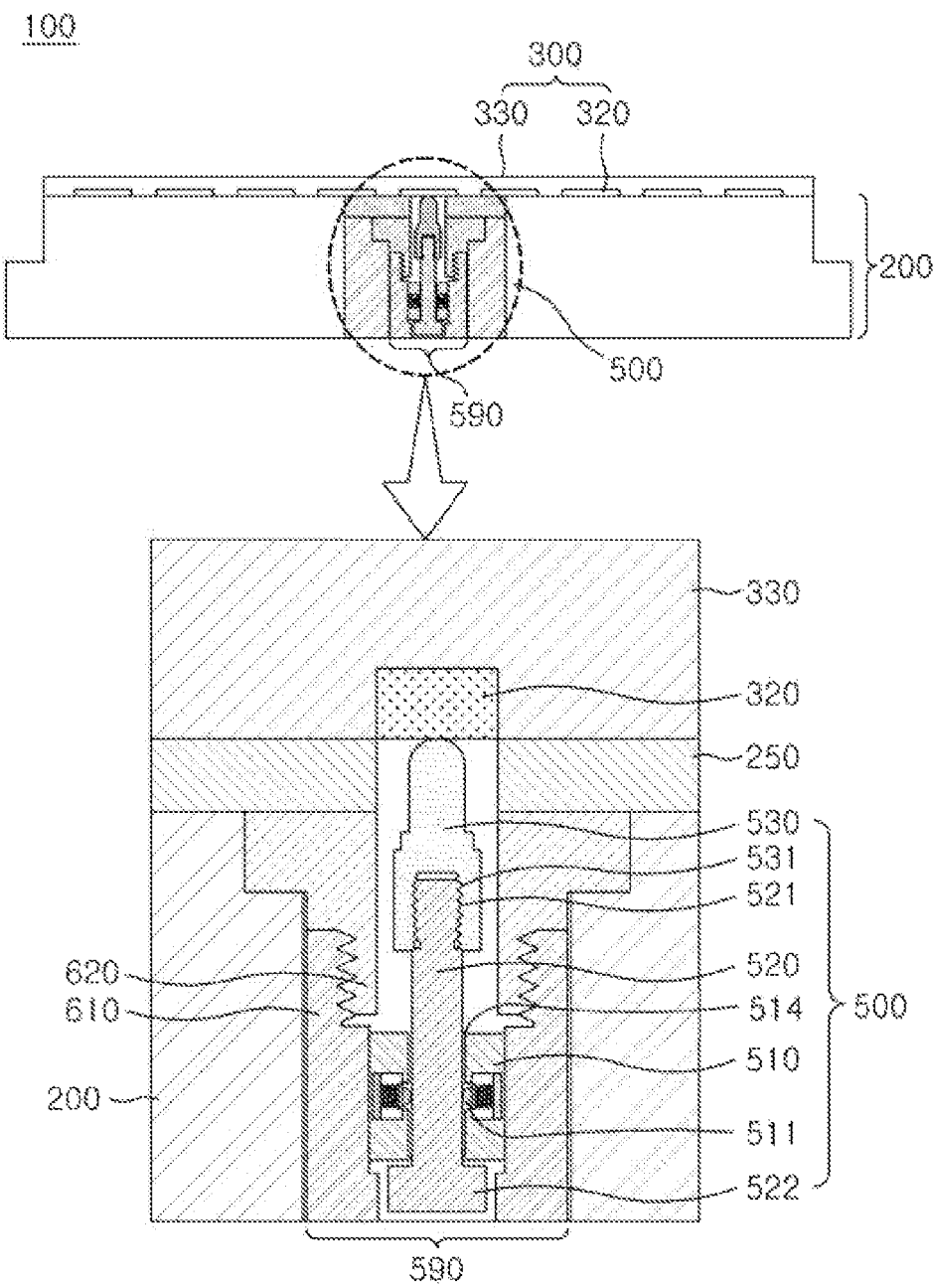
FIG. 2A is a simplified cross-sectional view of an electrostatic chuck and an enlarged view of an electrode part according to an embodiment of the present disclosure.

FIG. 2A is a simplified cross-sectional view of an electrostatic chuck 100 and an enlarged view of an electrode part 500 according to an embodiment of the present disclosure.

Referring to FIG. 2A, the electrostatic chuck 100 according to an embodiment of the present disclosure includes a base substrate 200 and an electrostatic chuck plate 300. The electrostatic chuck 100 preferably has a circular shape in a plan view from above, but may be designed in other shapes such as an oval or a square in some cases.

The base substrate 200 may be formed of a multi-layer structure including a plurality of metal layers. The base substrate 200 may have a structure formed by bonding plurality of metal layers, such as silver (Ag), gold (Au), aluminum (Al), nickel (Ni), tungsten (W), molybdenum (Mo), and titanium (Ti). Preferably, the base substrate 200 may be made of aluminum (Al). The metal layers may be bonded to each other through a brazing process, a welding process, a bonding process, or the like.

The electrostatic chuck plate 300 is fixed on the base substrate 200, which may be fixed on the base substrate 200 by using a predetermined adhesive 250. The base substrate 200 and the electrostatic chuck plate 300 may be separately formed to be bonded to each other, and in some cases, a structure of the electrostatic chuck plate 300 may be directly formed on the upper surface of the base substrate 200.

The electrostatic chuck plate 300 may include an electrode 320 and a dielectric layer 330 on the electrode 320. If necessary, the electrostatic chuck plate 300 may further include an insulation layer made of a ceramic material under the electrode 320 such that the electrode 320 is embedded between the insulation layer and the dielectric layer 330.

The electrode 320 may be made of a conductive metal material. As an example, the electrode 320 may be formed of at least one of silver (Ag), gold (Au), nickel (Ni), tungsten (W), molybdenum (Mo), and titanium (Ti), more preferably may be formed of tungsten (W). The electrode 320 may be formed using a thermal spray coating process or a screen-printing process. The electrode 320 has a thickness of about 1.0 μm to 100 μm. For example, preferably, a thickness of 1.0 to 30 μn may be applied when the electrode 320 is formed by a screen-printing process, and a thickness of 30 to 100 μm may be applied when the electrode 320 is formed by a thermal spray coating process. However, since it is difficult to form a too thin layer, it is not preferable that the electrode 320 has a thickness, such as less than 1.0 μm. In addition, in this case, the resistance value increases due to the porosity in the electrode and other defects, and the electrostatic adsorption force may be lowered according to the increased resistance value. Furthermore, when the thickness of the electrode 320 is too thick, such as exceeding 100 an arcing phenomenon may occur. Accordingly, the thickness of the electrode 320 preferably has an appropriate value in the range of about 1.0 μm to 100 μm. When a substrate (not shown) to be placed on the dielectric layer 330 is loaded, the electrode 320 formed as described above may receive a bias to generate an electrostatic force such that chucking is performed. When the substrate (not shown) is unloaded, dechucking is performed by applying an opposite bias to the electrode 320 to cause discharge. In addition, the electrode 320 may be a radio frequency (RF) electrode for generating plasma together with a predetermined gas supplied on a substrate (not shown).

The dielectric layer 330 may be made of a ceramic material. In an embodiment, the dielectric layer 330 may include one material selected from among aluminum oxide ($Al_2O_3$), aluminum nitride (AlN), silicon carbide (SiC), silicon nitride ($Si_3N_4$), silicon oxide ($SiO_2$), barium oxide (BaO), zinc oxide (ZnO), cobalt oxide (CoO), tin oxide ($SnO_2$), zirconium oxide ($ZrO_2$), Y2O3, YAG, YAM, YAP, and the like, which are the same material as the insulation layer. The dielectric layer 330 may be formed of the ceramic material as described above on the upper surface of the electrode 320 by thermal spray coating, attaching a ceramic sheet, etc. The dielectric layer 330 formed as described above may perform a dielectric function such that an electrostatic force is formed by the electrode 320.

When the electrostatic chuck 100 is mounted inside a chamber for a semiconductor process, the base substrate 200 and the electrostatic chuck plate 300 may have a predetermined cooling structure to uniformly cool a substrate (e.g., a glass substrate, a flexible substrate, a semiconductor wafer substrate, etc.) on the electrostatic chuck plate 300 by using an external cooling gas.

As shown in an enlarged view of the electrode unit 500 in FIG. 2A, the electrode part 500 is disposed in a hole 590 in a central portion of the base substrate 200 to supply electric power to the electrode 320.

The electrode part 500 includes housings 610 and 620 that are inserted into the hole 590 of the base substrate 200, and includes an electrode rod 520 which penetrates the inner walls of the housings 610 and 620 such that one end thereof is in contact with the electrode 320. Furthermore, the electrode part 500 may include an elastic support body configured to support the electrode rod 520 at three or more points on the inner walls of the housings 610 and 620. It is preferable that the elastic support body is accommodated in the support part 510 and includes a plurality of ball springs 511 configured to support the electrode rod 520 at three or more points. However, according to various embodiments, as necessary, the elastic support body may be installed in the housings 610 and 620 even without a separate support part 510, for example, directly in the body of a first housing part 610, such as a ball spring or an elastic support body capable of support the electrode rod 620 by applying an elastic force to other electrode rod 520, so as to support the electrode rod 520 at three or more points on the inner wall sides of the housings 610 and 620.

Hereinafter, a preferred embodiment in which the elastic support body is configured to include a plurality of ball springs 511 configured to support the electrode rod 520 at three or more points will be described.

Figure 4:
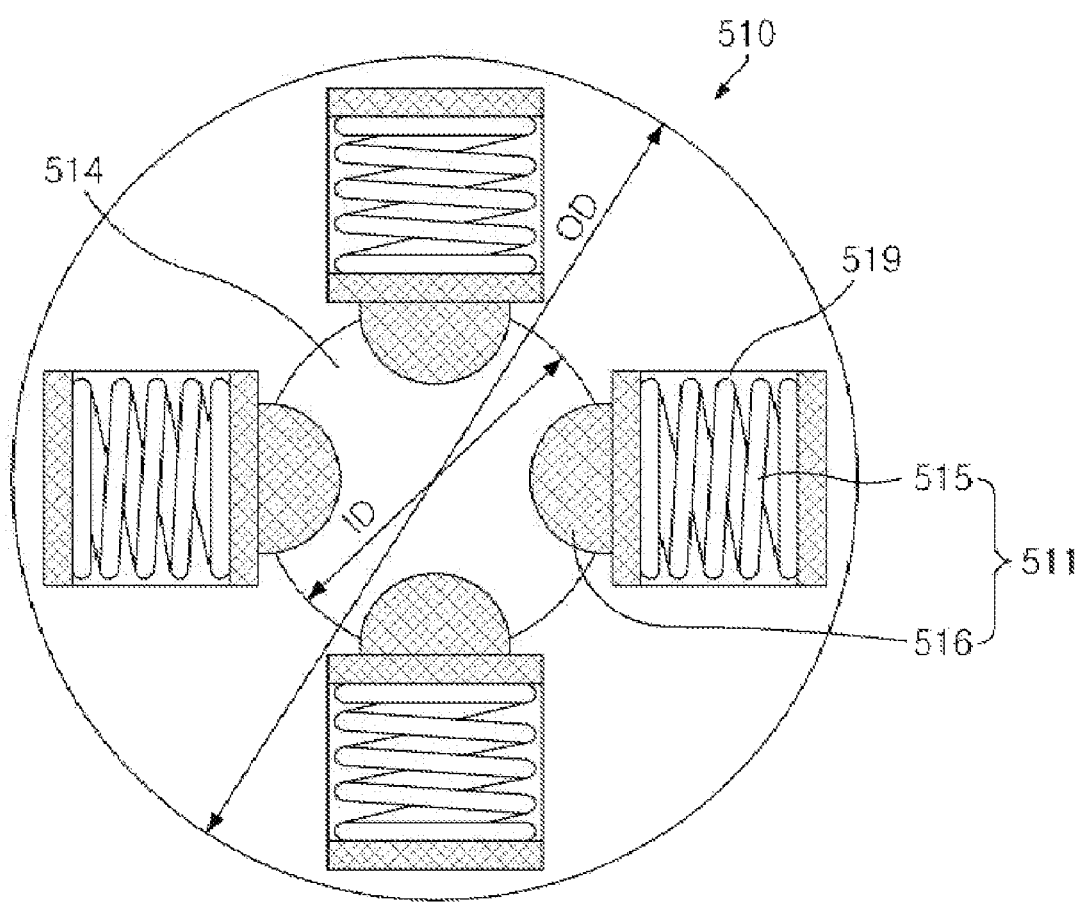
FIG. 4 illustrates a plate having a ball spring with respect to an electrode part of an electrostatic chuck according to an embodiment of the present disclosure.

The support part 510 may be provided in the housings 610 and 620, and the support part 510 may be a member configured to receive the plurality of ball springs 511 as the elastic support body in the housings 610 and 620. The support part 510 may have a through-hole 514, and three or more ball springs 511 provided along the through-hole 514 of the support part 510 to apply an elastic force toward the center of the through-hole 514 (four ball springs are illustrated in FIG. 4). The plurality of ball springs 511 may be disposed at predetermined intervals along the circumference in the through-hole 514. The support part 510 may be a cylindrical or polygonal tubular shape (e.g., a plate having a rectangular cross-section) having the through-hole 514 in a plan view from above, and may preferably be a cylindrical shape.

In addition, the electrode part 500 includes the electrode rod 520 passing through the through-hole 514 of the support part 510, and the electrode rod 520 is supported by the plurality of ball springs 511. The electrode rod 520 may receive an elastic force from all directions by the plurality of ball springs 511 and thus may be positioned within a predetermined range allowed by the elastic force of the ball spring 511 without significant shaking due to shear stress or the like.

Furthermore, the electrode rod 520 may include a contact part 530 formed to have one end in contact with the electrode 320. For example, the contact part 530 is screwed onto one end of the electrode rod 520 to be engaged therewith. The electrode rod 520 may include a head part 522 formed at the other end thereof and having a greater diameter than the through-hole 514 of the support part 510. The maximum diameter of the contact part 530 is also greater than the through-hole 514 of the support part 510.

When the electrostatic chuck plate 300 is fixed on the base substrate 200 by using the adhesive 250, the contact part 530 of the electrode part 500 provided in the hole 590 of the base substrate 200 may be in contact with the electrode 320. To this end, a portion of the electrode 320 at a position to be in contact with the contact part 530 needs to be exposed without the adhesive 250 disposed thereon. In addition, when the electrode 320 is embedded between the insulation layer (not shown) and the dielectric layer 330 as described above, in order to expose a portion of the electrode 320 at a position to be in contact with the contact part 530, the portion of the electrode 320 at the position to be contact with the contact part 530 needs to be in a state in which the insulation layer (not shown) as described above in addition to the adhesive 250 has been removed therefrom. In addition, the head part 522 of the electrode rod 520 should be properly fixed such that the head part 522 does not move up and down. For example, when the hole 590 in the central portion of the base substrate 200 is a through-hole, the head part 522 may be properly fixed to the housings 610 and 620 (see FIG. 3D). In addition, the hole 590 of the base substrate 200 is in the form of a recess formed in the base material of the base substrate 200 without penetrating the bottom surface (the lower surface in the drawing) of the base substrate 200, and the electrode part 500 may be stably placed in the recess. The head part 522 may be appropriately connected to a power supply member.

Figure 2B:
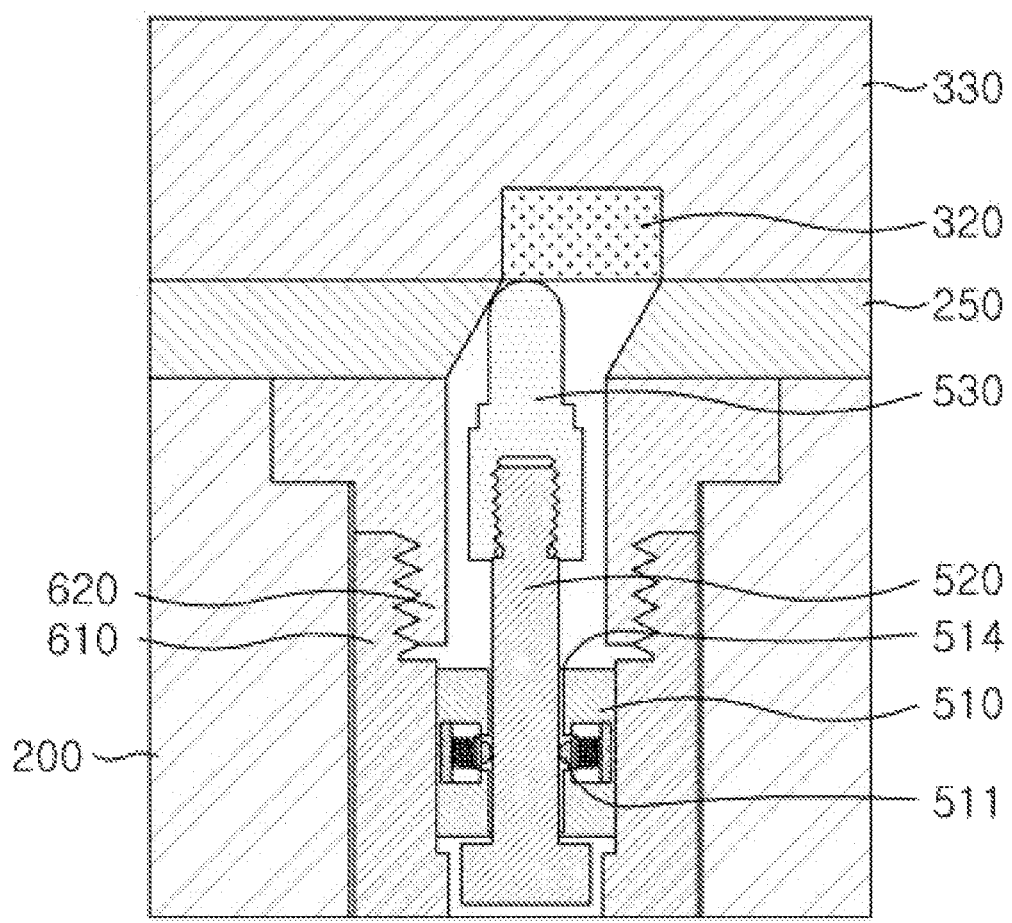
FIG. 2B illustrates shear stress occurring on a contact surface between an electrode and an electrode part of a general electrostatic chuck according to an embodiment of the present disclosure.

As described above, the electrode rod 520 and the contact part 530 coupled thereto according to the present disclosure are supported by receiving an elastic force by an elastic support body such as the plurality of ball springs 511, and accordingly, the electrode 320 and the contact part 530 can be prevented from being electrically disconnected from each other and can maintain a stable electrical connection therebetween even if the electrode rod 520 and the contact part 530 slightly move in the horizontal direction, as shown in FIG. 2B, by shear stress at a contact surface where the contact part 530 and the electrode 320 in the electrostatic chuck plate 300 made of a ceramic material for power supply from the electrode part 500 are in contact with each other by a physical force. In addition, by introducing the structure of the electrostatic chuck 100 of the present disclosure, the electrical disconnection in the electrode part 500 can be prevented in an etching process of a semiconductor process in which a thermal cycle of high temperature and low temperature is repeated, and the stable electrical connection structure described above can improve the lifespan of the electrostatic chuck.

FIGS. 3A to 3D illustrate a procedure for assembling the electrode part 500 of the electrostatic chuck 100 according to an embodiment of the present disclosure.

Referring to FIGS. 3A to 3D, the electrode part 500 includes housings 610 and 620, and includes a support part 510 having a plurality of ball springs 511 provided in the housings 610 and 620. The electrode part 500 further includes an electrode rod 520 including a male thread part 521 and a head part 522, and the electrode rod 520 includes a contact part 530 including a female thread part 531. The housings 610 and 620 include a first housing part 610 including a female screw part 611, and a second housing part 620 including a male screw part 621.

Figure 3A:
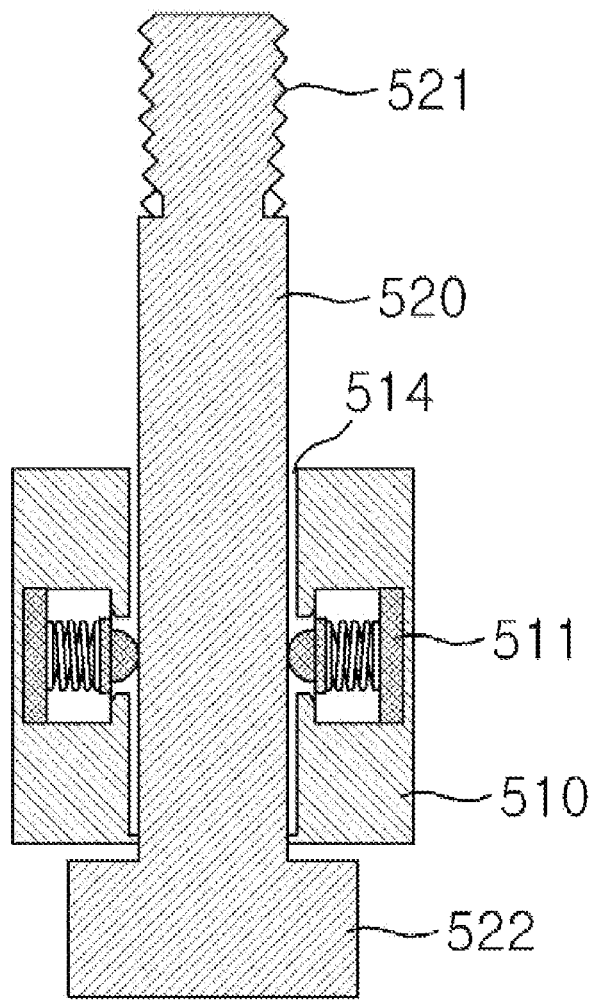
FIGS. 3A to 3D illustrate a procedure for assembling an electrode part of an electrostatic chuck according to an embodiment of the present disclosure.

First, as shown in FIG. 3A, the electrode rod 520 is introduced into the through-hole 514 of the support part 510 from the side of the male screw part 521 thereof to pass therethrough and be coupled thereto. Since the diameter of the head part 522 is greater than the diameter (ID) of the through-hole 514, the support part 510 may not escape from the side of the head part 522.

Figure 3B:
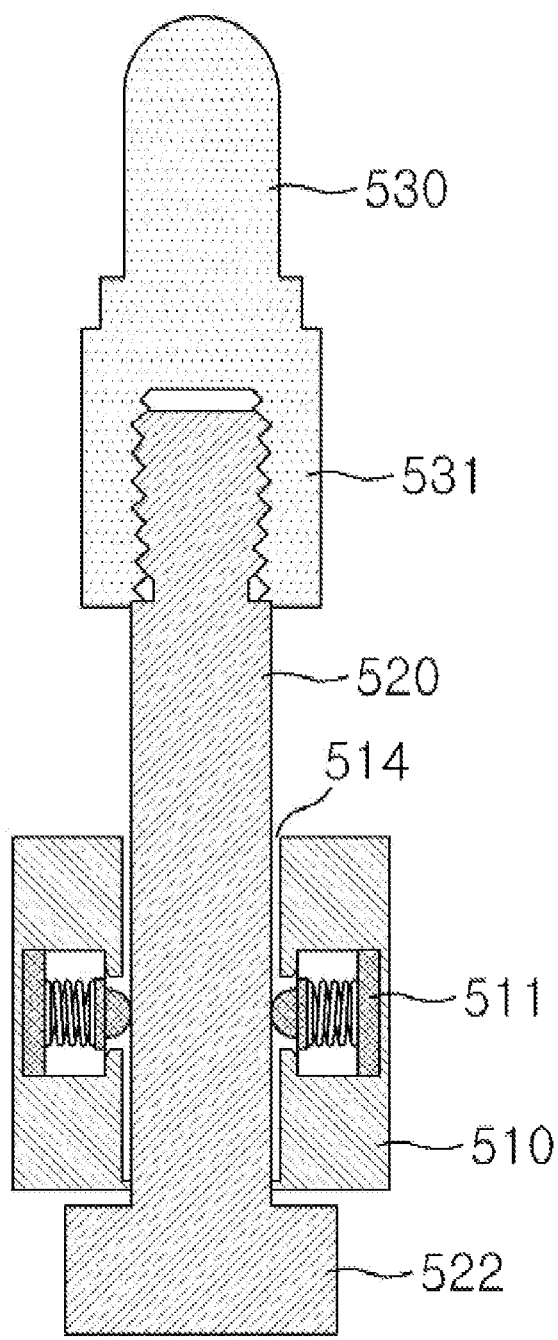

Referring to FIG. 3B, the male thread part 521 of the electrode rod 520 is coupled to the female thread part 531 of the contact part 530.

Figure 3C:
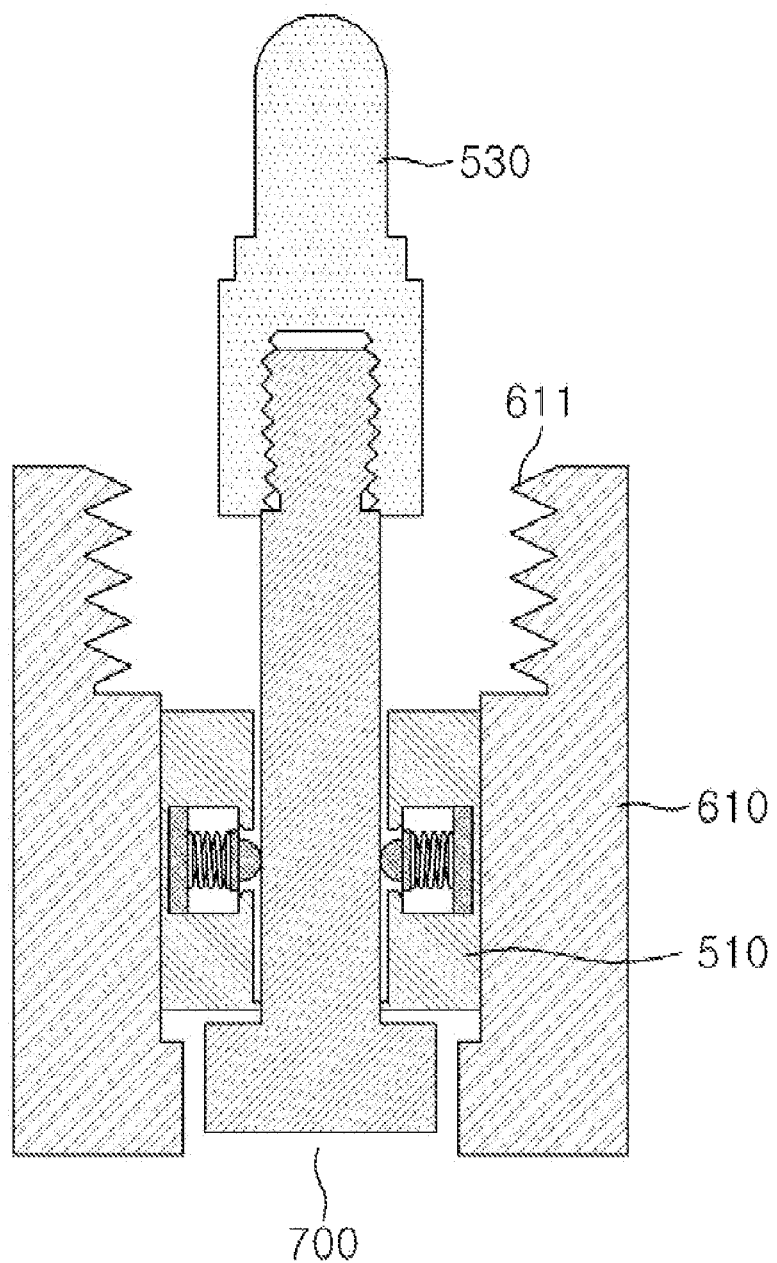

Referring to FIG. 3C, the first housing part 610 includes a female screw part 611 formed at an end of a through-hole 700 (e.g., a cylindrical shape).

Figure 3D:
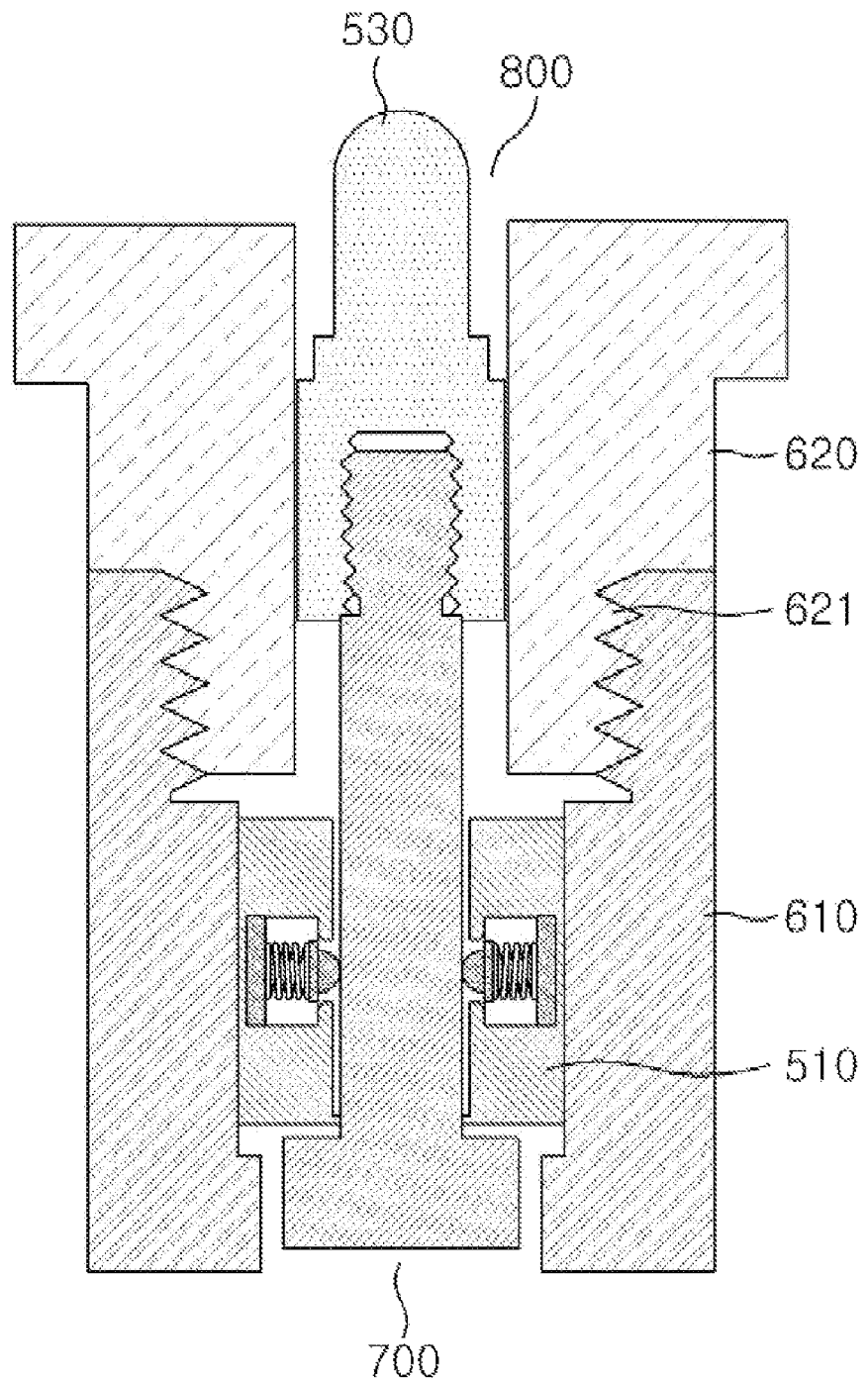

Referring to FIG. 3D, the second housing part 620 includes a male screw part 621 at an end of a through-hole 800.

The support part 510 and the head part 522 are stably placed in the through-hole 700 of the first housing part 610. That is, the support part 510, and the head part 522 of the electrode rod 520 to which the electrode rod 520 in the through-hole 514 of the support part 510 is coupled is stably placed in the through-hole 700 of the first housing part 610.

The female screw part 611 of the first housing part 610 is engaged with the male screw part 621 of the second housing part 620 by screw coupling. At this time, the contact part 530 of the electrode rod 520 is configured to pass through the through-hole 800 of the second housing part 620 such that the contact part 530 comes out of the through-hole 800.

FIG. 4 explains the support part 510 having the ball spring 511 with respect to the electrode part 500 of the electrostatic chuck 100 according to an embodiment of the present disclosure.

Referring to FIG. 4, the support part 510 includes at least three or more ball springs 511 to apply an elastic force at multiple points toward the center thereof along the through-hole 514. Corresponding groove parts 519 corresponding to the plurality of ball springs 511 are provided in the support part 510, and the plurality of ball springs 511 are stably placed in the groove parts 519, respectively.

Each of the ball springs 511 may include a spring 515 having one side supported on the bottom surface of the groove part 519, and a ball 516 coupled to the other side of the spring 515. The electrode rod 520 having passed through the through-hole 514 of the support part 510 is supported by an elastic force of the spring 515 by the ball 516 coupled to the other side of the spring 515. Each ball 516 may enter the inside of the corresponding groove part 519 when a force is applied thereto, and when the force applied to each ball 516 is removed, the ball 516 may receive a force causing the ball 516 to come out from the inside of the corresponding groove part 519 by an elastic restoring force of the spring 515.

Here, the material of the ball spring 511 is a material which is elastically deformable at a high temperature, and for example, SUS (use in the range of about 250° C. or less), INCONEL (use in the range of about 450° C. or less), etc. may be applied. The body of the support part 510 between the inner diameter (ID) and the outer diameter (OD) of the support part 510, excluding the through-hole 514, is preferably made of a ceramic material as described above. In addition, materials of the electrode rod 520 and the contact part 530 coupled thereto are preferably a low thermal expansion metal material, and for example, Ti, Kovar, Mo or an alloy thereof may be applied.

As described above, the electrode rod 520 and the contact part 530 coupled thereto according to the present disclosure are supported by receiving an elastic force by an elastic support body such as the plurality of ball springs 511, and accordingly, the electrode 320 and the contact part 530 can be prevented from being electrically disconnected from each other and can maintain a stable electrical connection therebetween even if the electrode rod 520 and the contact part 530 slightly move in the horizontal direction by shear stress at a contact surface where the contact part 530 and the electrode 320 in the electrostatic chuck plate 300 made of a ceramic material for power supply from the electrode part 500 are in contact with each other by a physical force. In addition, by introducing the structure of the electrostatic chuck 100 of the present disclosure, the electrical disconnection in the electrode part 500 can be prevented in an etching process of a semiconductor process in which a thermal cycle of high temperature and low temperature is repeated, and the stable electrical connection structure described above can improve the lifespan of the electrostatic chuck.

The process temperature of the electrostatic chuck 100 for a high-temperature process that has been recently used is 150° C. or higher to increase the etching efficiency in a semiconductor process. For example, since a thermal cycle is repeated such that the surface temperature of the upper electrostatic chuck plate 300 of the electrostatic chuck 100 is at a high temperature of 150° C. or higher and the surface temperature of the lower base substrate 200 of the electrostatic chuck 100 is at a temperature of 0 to 90° C., the stress in the electrode part 500 may be further increased. For example, the thermal expansion coefficient of the upper electrostatic chuck plate 300 made of a ceramic material is 7 μm/m° C., and the thermal expansion coefficient of the lower base substrate 200 made of aluminum is 23.6 μm/m° C. Accordingly, the present disclosure can prevent the electrical disconnection of the electrode part in an etching process of a semiconductor process in which a thermal cycle of high temperature and low temperature is repeated, and the stable electrical connection structure described above can improve the lifespan of the electrostatic chuck.

As described above, in the present disclosure, specific matters such as specific elements, etc., and limited embodiments and drawings have been described, but these are only provided to help a more general understanding of the present disclosure, and the present disclosure is not limited to the above embodiments, and various modifications and variations will be possible without departing from the essential characteristics of the present disclosure by those of ordinary skill in the art to which the present disclosure belongs. Therefore, the spirit of the present disclosure should not be limited to the described embodiments, and all technical ideas with equivalent or equivalent modifications to the claims as well as the claims to be described later should be interpreted to be included in the scope of the present disclosure.

What is claimed is:

1. An electrostatic chuck comprising:
   a base substrate;
   an electrostatic chuck plate fixed on the base substrate, the electrostatic chuck plate having an electrode therein; and
   an electrode part disposed in a hole in the base substrate to supply power to the electrode,
   wherein the electrode part comprises:
   a housing inserted into the hole in the base substrate;
   an electrode rod passing through the inner wall of the housing such that one end thereof is in contact with the electrode; and an elastic support body configured to support the electrode rod at multiple points on the inner wall of the housing, wherein the elastic support body applies an elastic force to the electrode rod toward the center at multiple points along the circumference of the inner wall of the housing.

2. The electrostatic chuck of claim 1, wherein the electrode part comprises a support part disposed in the inner wall of the housing and configured to receive a plurality ball springs as the elastic support body, wherein the support part comprises a plurality of ball springs provided along the circumference thereof and configured to apply an elastic force toward the center thereof.

3. The electrostatic chuck of claim 2, wherein the electrode rod comprises a contact part which is engaged with the one end thereof by screw coupling to be in contact with the electrode.

4. The electrostatic chuck of claim 3, wherein the electrode rod further comprises a head part formed at the other end thereof and having a diameter greater than a through-hole of the support part, and the housing comprises:

a first housing part comprising the support part and a second through-hole in which the head part of the electrode rod is stably placed; and a second housing part having a third through-hole through which the contact part passes and engaged with the first housing part.

5. The electrostatic chuck of claim 4, wherein the first housing part and the second housing part are engaged with each other by screw coupling.

6. The electrostatic chuck of claim 2, wherein the support part comprises corresponding groove parts in which the plurality of ball springs are stably placed, and each of the ball springs stably placed in the groove parts comprises a spring having one side supported by the bottom surface of the corresponding groove part, and a ball coupled to the other side of the spring.

7. The electrostatic chuck of claim 2, wherein the support part has a cylindrical or polygonal tubular shape.

* * * * *